United States Patent
Kim et al.

(10) Patent No.: US 10,544,314 B2
(45) Date of Patent: Jan. 28, 2020

(54) COMPOSITION FOR SOLAR CELL ELECTRODES AND ELECTRODE FABRICATED USING THE SAME

(71) Applicant: SAMSUNG SDI CO., LTD., Yongin-si, Gyeonggi-do (KR)

(72) Inventors: Tae Joon Kim, Suwon-si (KR); Sang Hee Park, Suwon-si (KR); Myung Sung Jung, Suwon-si (KR); Koon Ho Kim, Suwon-si (KR); Hyun Jin Ha, Suwon-si (KR)

(73) Assignee: SAMSUNG SDI CO., LTD., Yongin-si, Gyeonggi-do (KR)

(*) Notice: Subject to any disclaimer, the term of this patent is extended or adjusted under 35 U.S.C. 154(b) by 167 days.

(21) Appl. No.: 14/587,907

(22) Filed: Dec. 31, 2014

(65) Prior Publication Data
US 2015/0291811 A1    Oct. 15, 2015

(30) Foreign Application Priority Data
Apr. 10, 2014  (KR) .................. 10-2014-0043088

(51) Int. Cl.
*H01B 1/02* (2006.01)
*C09D 5/24* (2006.01)
*H01L 31/0224* (2006.01)

(52) U.S. Cl.
CPC ........ *C09D 5/24* (2013.01); *H01L 31/022425* (2013.01); *H01B 1/02* (2013.01)

(58) Field of Classification Search
CPC ...................................................... H01B 1/02
See application file for complete search history.

(56) References Cited

U.S. PATENT DOCUMENTS

| 4,565,764 A | * | 1/1986 | Nakahara | ............... G03G 9/093 264/4 |
| 6,083,426 A | * | 7/2000 | Shimasaki | ............... H01B 1/22 252/500 |

(Continued)

FOREIGN PATENT DOCUMENTS

| CN | 101840743 A | 9/2010 |
| CN | 102629496 A | 8/2012 |

(Continued)

OTHER PUBLICATIONS

Chinese Office Action dated Jul. 28, 2016 in Corresponding Chinese Patent Application No. 201410852237.2.

(Continued)

*Primary Examiner* — William D Young
(74) *Attorney, Agent, or Firm* — Lee & Morse, P.C.

(57) ABSTRACT

A composition for solar cell electrodes and a solar cell electrode fabricated using the composition, the composition including a conductive powder; a glass frit; an organic vehicle; and a surface tension modifier, wherein the surface tension modifier has a surface tension of about 40 mN/m to about 65 mN/m, and the composition has a thixotropic index (TI) of about 3 to about 10 as represented by Equation 1:

TI=(viscosity at 10 rpm/viscosity at 100 rpm),  [Equation 1]

in Equation 1, the thixotropic index is calculated using viscosity values of the composition measured at 10 rpm and 100 rpm and at 23° C. with a No. 14 Spindle using a rotary viscometer.

7 Claims, 1 Drawing Sheet

(56) References Cited

U.S. PATENT DOCUMENTS

| | | | |
|---|---|---|---|
| 2009/0200070 A1* | 8/2009 | Kato | B22F 1/0074 174/257 |
| 2011/0272022 A1 | 11/2011 | Dan et al. | |
| 2012/0325308 A1 | 12/2012 | Kim et al. | |
| 2013/0255766 A1* | 10/2013 | Shin | H01B 1/22 136/256 |
| 2014/0048116 A1* | 2/2014 | Schulz | H01L 31/022425 136/244 |
| 2014/0287159 A1* | 9/2014 | Carmody | C09D 5/24 427/555 |
| 2015/0136219 A1* | 5/2015 | Koike | H01L 31/02242 136/256 |
| 2016/0043243 A1* | 2/2016 | Tohoda | H01L 31/0747 438/98 |

FOREIGN PATENT DOCUMENTS

| | | |
|---|---|---|
| CN | 103400634 A | 11/2013 |
| KR | 10-2007-0055489 A | 5/2007 |
| KR | 10 2010-0000685 A | 1/2010 |
| KR | 10-2010-0069950 A | 6/2010 |
| KR | 10-2011-0040713 A | 4/2011 |

OTHER PUBLICATIONS

Taiwanese Office Action dated Jul. 21, 2015 in Corresponding Taiwanese Patent Application No. 103146421.

Korean Office Action dated Dec. 20, 2016 in Corresponding Korean Patent Application No. 10-2014-0043088.

Office Action dated Jul. 3, 2018 in the corresponding Chinese Patent Application No. 201410852237.2.

* cited by examiner

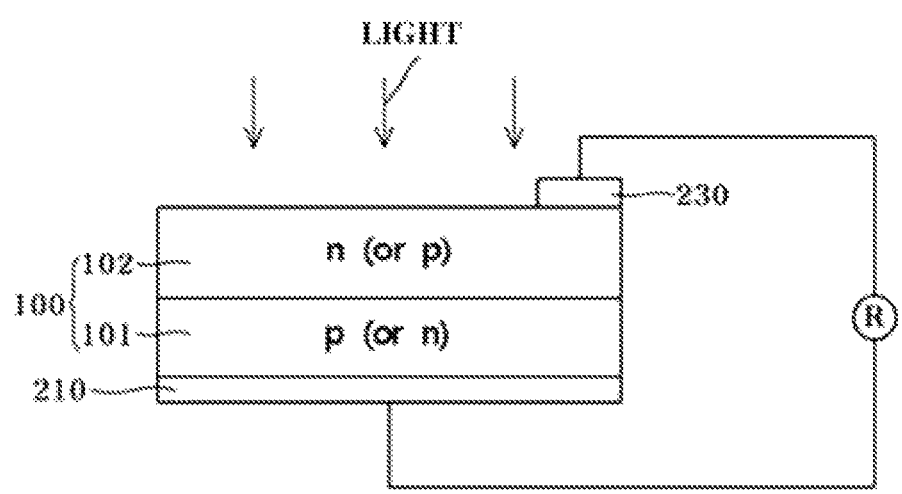

COMPOSITION FOR SOLAR CELL ELECTRODES AND ELECTRODE FABRICATED USING THE SAME

CROSS-REFERENCE TO RELATED APPLICATION

Korean Patent Application No. 10-2014-0043088, filed on Apr. 10, 2014, in the Korean Intellectual Property Office, and entitled: "Composition for Solar Cell Electrodes and Electrode Fabricated Using the Same," is incorporated by reference herein in its entirety.

BACKGROUND

1. Field

Embodiments relate to a composition for solar cell electrodes and electrodes fabricated using the same.

2. Description of the Related Art

Solar cells generate electricity using the photovoltaic effect of a p-n junction that converts photons of light, e.g., sunlight, into electricity. In the solar cell, front and rear electrodes may be formed on upper and lower surfaces of a semiconductor wafer or substrate with the p-n junctions, respectively. Then, the photovoltaic effect at the p-n junction may be induced by light, e.g., sunlight, entering the semiconductor wafer, and electrons generated by the photovoltaic effect at the p-n junction may provide electric current to the outside through the electrodes.

SUMMARY

Embodiments are directed to a composition for solar cell electrodes and electrodes fabricated using the same.

The embodiments may be realized by providing a composition for solar cell electrodes, the composition including a conductive powder; a glass frit; an organic vehicle; and a surface tension modifier, wherein the surface tension modifier has a surface tension of about 40 mN/m to about 65 mN/m, and the composition has a thixotropic index (TI) of about 3 to about 10 as represented by Equation 1:

TI=(viscosity at 10 rpm/viscosity at 100 rpm), [Equation 1]

in Equation 1, the thixotropic index is calculated using viscosity values of the composition measured at 10 rpm and 100 rpm and at 23° C. with a No. 14 Spindle using a rotary viscometer.

The surface tension modifier may include ethylene glycol, diethylene glycol, triethylene glycol, tetraethylene glycol, polyethylene glycol, 1,3-propanediol, 1,4-butanediol, 1,5-pentanediol, propylene carbonate, formamide, glycerol, or furfural.

The composition may include about 50 wt % to about 90 wt % of the conductive powder; about 1 wt % to about 15 wt % of the glass fit; about 5 wt % to about 40 wt % of the organic vehicle; and about 0.1 wt % to about 40 wt % of the surface tension modifier.

The conductive powder may include one or more of silver powder, gold powder, palladium powder, platinum powder, copper powder, chromium powder, cobalt powder, aluminum powder, tin powder, lead powder, zinc powder, iron powder, iridium powder, osmium powder, rhodium powder, tungsten powder, molybdenum powder, nickel powder, or indium tin oxide (ITO) powder.

The glass frit may include a leaded glass frit, a lead-free glass frit, or a mixture thereof.

The glass fit may have an average particle diameter (D50) of about 0.1 μm to about 5 μm.

The composition may further include one or more of a dispersant, a thixotropic agent, a plasticizer, a viscosity stabilizer, an anti-foaming agent, a pigment, a UV stabilizer, an antioxidant, or a coupling agent.

The organic vehicle may include a binder resin and a solvent, an amount by weight of the binder resin being greater than or equal to an amount by weight of the solvent.

The solvent may include one or more of hexane, toluene, ethyl cellosolve, cyclohexanone, butyl cellosolve, butyl carbitol, dibutyl carbitol, butyl carbitol acetate, propylene glycol monomethyl ether, hexylene glycol, terpineol, texanol, methylethylketone, benzylalcohol, γ-butyrolactone, or ethyl lactate.

The binder resin may be included in the organic vehicle in an amount by weight of 1 to about 6 times an amount by weight of the solvent.

The embodiments may be realized by providing a solar cell electrode fabricated using the composition for solar cell electrodes according to an embodiment.

The embodiments may be realized by providing a method of manufacturing a solar cell, the method including applying the composition for solar cell electrodes according to an embodiment to a substrate; and firing the substrate having the composition thereon.

BRIEF DESCRIPTION OF THE DRAWING

Features will be apparent to those of skill in the art by describing in detail exemplary embodiments with reference to the attached drawing in which:

FIG. 1 illustrates a schematic view of a solar cell in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Composition for Solar Cell Electrodes

A composition for solar cell electrodes according to an embodiment may include, e.g., a conductive powder (A), a glass frit (B), an organic vehicle (C) and a surface tension modifier (D). The composition may be printed in a fine-line width on a substrate by, e.g., screen-printing. Solar cell electrodes fabricated using the composition may exhibit excellent conversion efficiency.

Below, each component of the composition for solar cell electrodes according to an embodiment will be described in more detail.

(A) Conductive Powder

The conductive powder may include a suitable organic powder or inorganic powder having conductivity. The conductive powder may include, e.g., a metal-containing powder. In an implementation, the conductive powder may include, e.g., silver (Ag) powder, gold (Au) powder, palladium (Pd) powder, platinum (Pt) powder, copper (Cu) powder, chromium (Cr) powder, cobalt (Co) powder, aluminum (Al) powder, tin (Sn) powder, lead (Pb) powder, zinc (Zn) powder, iron (Fe) powder, iridium (Ir) powder, osmium (Os) powder, rhodium (Rh) powder, tungsten (W) powder, molybdenum (Mo) powder, nickel (Ni) powder, and/or indium tin oxide (ITO) powder. These may be used alone or in combination of two or more thereof. In an implementation, the conductive powder may include silver (Ag) powder, and may further include nickel (Ni) powder, cobalt (Co) powder, iron (Fe) powder, zinc (Zn) powder, and/or copper (Cu) powder.

The conductive powder may have an average particle diameter (D50) of, e.g., about 0.1 μm to about 10 μm. In an implementation, the conductive powder may have an average particle diameter of, e.g., about 0.2 μm to about 7 μm. In an implementation, the conductive powder may have an average particle diameter of, e.g., about 0.5 μm to about 5 μm.

The conductive powder may be present in the composition in an amount of, e.g., about 50 wt % to about 90 wt %, based on a total weight of the composition. In an implementation, the conductive powder may be present in an amount of, e.g., about 70 wt % to about 90 wt %. Within this range, the conductive powder may help reduce and/or prevent deterioration in conversion efficiency (which may otherwise be caused by a resistance increase and difficulty in forming the paste due to relative reduction in amount of the organic vehicle), and may also help provide suitable dispersion, fluidity, and printability to the composition.

(B) Glass Frit

The glass frit may help enhance adhesion between the conductive powder and the wafer. The glass frit may help form silver crystal grains in an emitter region by etching an anti-reflection layer and melting the silver powder so as to help reduce contact resistance during the baking process of the composition for electrodes. Further, during the baking process, the glass frit may soften and may decrease the baking temperature.

When the area of the solar cell is increased in order to help improve solar cell efficiency, solar cell contact resistance may increase. Thus, minimizing both serial resistance (Rs) and influence on the p-n junction may be desirable. In addition, as the baking temperatures varies within a broad range with increasing use of various wafers having different sheet resistances, it may be desirable that the glass frit help secure sufficient thermal stability to withstand a wide range of baking temperatures.

The glass frit may include, e.g., leaded glass frits or lead-free glass frits, which may suitably be used in compositions for solar cell electrodes.

In an implementation, the glass frit may include, e.g., lead oxide, silicon oxide, tellurium oxide, bismuth oxide, zinc oxide, boron oxide, aluminum oxide, tungsten oxide, or combinations thereof. In an implementation, the glass frit may include, e.g., zinc oxide-silicon oxide (ZnO—$SiO_2$), zinc oxide-boron oxide-silicon oxide (ZnO—$B_2O_3$—$SiO_2$), zinc oxide-boron oxide-silicon oxide-aluminum oxide (ZnO—$B_2O_3$—$SiO_2$—$Al_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—ZnO—$B_2O_3$—$SiO_2$), bismuth oxide-zinc oxide-boron oxide-silicon oxide-aluminum oxide ($Bi_2O_3$—ZnO—$B_2O_3$—$SiO_2$—$Al_2O_3$) glass frits, or the like.

The glass frit may be prepared by a suitable method. For example, the metal oxides may be mixed in a predetermined ratio. Mixing may be carried out using a ball mill or a planetary mill. The mixture may be melted at about 900° C. to about 1,300° C., followed by quenching to or at about 25° C. Then, the obtained resultant may be subjected to pulverization using a disk mill, a planetary mill, or the like, thereby preparing a glass frit.

The glass frit may have a spherical or amorphous shape.

The glass frit may have an average particle diameter D50 of, e.g., about 0.1 μm to about 5 μm.

The glass fit may include a suitable commercially available product, or may be prepared by selectively melting, e.g., silicon dioxide ($SiO_2$), aluminum oxide ($Al_2O_3$), boron oxide ($B_2O_3$), bismuth oxide ($Bi_2O_3$), sodium oxide ($Na_2O$), zinc oxide (ZnO), or the like, so as to have a desired composition.

The glass fit may be present in the composition in an amount of, e.g., about 1 wt % to about 15 wt %, based on the total weight of the composition. In an implementation, the glass frit may be present in an amount of, e.g., about 2 wt % to about 10 wt %, based on the total weight of the composition. Within this content range, the glass frit may provide suitable dispersion, fluidity, and printability to the composition.

(C) Organic Vehicle

The organic vehicle may impart suitable viscosity and rheological characteristics for printing to the composition for solar cell electrodes through mechanical mixing with inorganic components of the composition.

The organic vehicle may be a suitable organic vehicle used in solar cell electrode compositions. In an implementation, the organic vehicle may include, e.g., a binder resin, a solvent, or the like.

The binder resin may include, e.g., an acrylate resins or a cellulose resin. In an implementation, ethyl cellulose may be used as the binder resin. In an implementation, the binder resin may include, e.g., ethyl hydroxyethyl cellulose, nitrocellulose, blends of ethyl cellulose resin and phenol resin, alkyd, phenol, acrylate ester, xylene, polybutane, polyester, urea, melamine, vinyl acetate resins, wood rosin, polymethacrylates of alcohols, or the like.

The solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, texanol, methylethylketone, benzylalcohol, γ-butyrolactone, ethyl lactate, or combinations thereof.

In an implementation, the organic vehicle may include, e.g., about 2.5 wt % to about 37.5 wt % of the binder resin and residual amount of the solvent, based on a total weight of the composition. More specifically, the binder resin may be present in amount of about 2.5 wt % to about 35 wt %, e.g., about 2.5 wt % to about 30 wt %, about 5.5 wt % to about 28 wt %, about 6.4 wt % to about 23 wt %, about 7.5 wt % to about 21 wt % or about 7.5 wt % to about 20 wt %, based on a total weight of the composition. And the solvent resin may be present in amount of residual amount or about 2.5 wt % to about 37.5 wt %, based on a total weight of the composition. Within this range, the organic vehicle may provide appropriate rheological characteristics and printability.

In an implementation, an amount (e.g., weight) of the binder resin in the composition may be about 0.5 times to 10 times, e.g., about 1 time to about 6 times, about 1.2 times to about 6 times, about 2 times to about 5.5 times or about 2.5 times to about 5.5 times the amount (e.g., weight) of the solvent included in the composition. Within this range, the organic vehicle may impart suitable viscosity and rheological characteristics for printing to the composition for solar cell electrodes.

The organic vehicle may be present in the composition in an amount of, e.g., about 5 wt % to about 40 wt %, based on the total weight of the composition. Within this range, the organic vehicle may help provide sufficient adhesive strength and excellent printability to the composition.

(D) Surface Tension Modifier

The composition may include a surface tension modifier. As used herein, the surface tension modifier refers to a co-solvent. In an implementation, the surface tension modifier may have a surface tension of about 40 mN/m or more, e.g., about 40 mN/m to about 65 mN/m. For example, the surface tension modifier may be different from the solvent of the organic vehicle.

The surface tension modifier may include, e.g., ethylene glycol, diethylene glycol, triethylene glycol, tetraethylene glycol, polyethylene glycol, 1,3-propanediol, 1,4-butanediol, 1,5-pentanediol, propylene carbonate, formamide, glycerol, and/or furfural.

The surface tension modifier may be present in the composition in an amount of, e.g., about 0.1 wt % to about 40 wt %, based on the total weight of the composition. In an implementation, the surface tension modifier may be present in an amount of about 0.1 wt % to about 25 wt %, e.g., about 0.5 wt % to about 10 wt %, based on the total weight of the composition. Within this range, the surface tension modifier may help provide suitable fluidity and printability to the composition.

In an implementation, a weight ratio of the organic vehicle to the surface tension modifier may be, e.g., about 5:1 to about 15:1. Within this range, the composition may exhibit improved fluidity and printability, and may be advantageously printed in a fine pattern.

(E) Additive

The composition may further include an additive, e.g., to help enhance flow and process properties and stability, as desired. The additive may include, e.g., dispersants, thixotropic agents, plasticizers, viscosity stabilizers, anti-foaming agents, pigments, UV stabilizers, antioxidants, coupling agents, or the like. The additive may be used alone or as mixtures thereof. The additive may be present in the composition in an amount of, e.g., about 0.1 wt % to about 5 wt %, based on the total weight of the composition.

The composition for solar cell electrodes according to an embodiment may have a thixotropic index (TI) of, e.g., about 3 to about 10, as represented by the following Equation 1. In an implementation, the composition may have a thixotropic index (TI) of, e.g., about 3.5 to about 8.5. Within this range, the composition may be applicable to screen-printing and may be printed in a fine pattern, thereby providing excellent conversion efficiency.

$$TI=\text{(viscosity at 10 rpm/viscosity at 100 rpm)} \quad \text{[Equation 1]}$$

In Equation 1, the thixotropic index (TI) is calculated by substituting or using the viscosity values (of the composition) measured at each rpm (e.g., 10 rpm and 100 rpm) and at 23° C. with a No. 14 Spindle using a rotary viscometer.

For example, the thixotropic index TI may be defined as a ratio of viscosity values measured at different revolutions per minute of a rotary viscometer. For example, a thixotropic index (TI) of 10 means a ratio of viscosity at 10 rpm to viscosity at 100 rpm as measured with a No. 14 Spindle using the rotary viscometer at 23° C. was 10:1. An example of the rotary viscometer may include HBDV-II+Pro (Brookfield Co., Ltd.).

In an implementation, the composition for solar cell electrodes may have a viscosity of, e.g., about 200 Pa·s to about 600 Pa·s, to help secure printability. Here, the viscosity may be measured with the rotary viscometer at 23° C. and 10 rpm.

When the composition for solar cell electrodes according to an embodiment is printed on a substrate, e.g., by screen-printing, a printed pattern may have, e.g., a line width of about 65 μm to about 90 μm and a line thickness of about 15 μm to about 20 μm. In an implementation, the composition may provide an aspect ratio (line thickness/line width) of about 0.15 or more, e.g., about 0.15 to about 0.50 or about 0.20 to about 0.30. Within this range of aspect ratio, the composition may exhibit excellent printability.

Solar Cell Electrode and Solar Cell Including the Same

The embodiments may provide an electrode formed of or prepared from the composition for solar cell electrodes and a solar cell including the same. FIG. 1 illustrates a solar cell in accordance with an embodiment.

Referring to FIG. 1, a rear electrode 210 and a front electrode 230 may be formed by printing and baking the composition according to an embodiment on a wafer or substrate 100 (that includes a p-layer (or n-layer) 101 and an n-layer (or p-layer) 102), which will serve as an emitter. For example, a preliminary process of preparing the rear electrode may be performed by printing the composition on the rear surface of the wafer and drying the printed composition at about 200° C. to about 400° C. for about 10 seconds to 60 seconds. A preliminary process for preparing the front electrode may be performed by printing the composition on the front surface of the wafer and drying the printed composition. Then, the front electrode and the rear electrode may be formed by baking the wafer at about 400° C. to about 950° C., e.g., at about 750° C. to about 950° C., for about 30 seconds to 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Examples 1 to 14 and Comparative Examples 1 to 3

Example 1

As a binder resin, 5 wt % of ethyl cellulose (STD4, Dow Chemical Company) was dissolved in 6.4 wt % of butyl carbitol (Dow Chemical Company) at 60° C. to prepare an organic vehicle, and 85 wt % of spherical silver powder (AG-4-8, Dowa Hightech Co., Ltd.) having an average particle diameter of 2.0 μm, 3 wt % of glass frits (CI-124, Particlogy Co., Ltd.) having an average particle diameter of 1.0 μm, 0.1 wt % of tetraethylene glycol (Sigma-Aldrich, Inc.) as a surface tension modifier, and 0.2 wt % of a dispersant BYK102 (BYK-Chemie) and 0.3 wt % of a thixotropic agent Thixatrol ST (Elementis Co.) (as additives) were added to the organic vehicle, followed by mixing and kneading in a 3-roll kneader, thereby preparing a composition for solar cell electrodes. The composition was printed in a predetermined pattern on a surface of a wafer by screen-printing. Properties of the composition were measured by the following method and results are shown in the following Table 2.

Examples 2 to 14 and Comparative Examples 1 to 3

Compositions for solar cell electrodes were prepared in the same manner as in Example 1 except that the components of the compositions were used in amounts as listed in Tables 2 and 3, below. Thereafter, the compositions were printed by screen-printing.

Property Measurements

Measurement of thixotropic index (TI): Thixotropic index was calculated using the ratio of viscosity values measured at 23° C. with a No. 14 Spindle using a rotary viscometer HBDV-II+Pro (Brookfield Co., Ltd.). For measurement of viscosity, a sample cup was completely filled with a specimen and equipped with the spindle. After temperature stabilization for 5 minutes, viscosity was measured at maintenance times shown in Table 1, below.

TABLE 1

|  | 1 rpm | 2 rpm | 5 rpm | 10 rpm | 20 rpm | 50 rpm | 100 rpm |
|---|---|---|---|---|---|---|---|
| Maintenance time | 60 sec | 30 sec | 15 sec | 15 sec | 15 sec | 15 sec | 15 sec |

Thixotropic index (TI) in Equation 1 was calculated based on the measured viscosity values, and is shown in Tables 2 and 3, below.

Property Evaluation

Measurement of short circuit current and conversion efficiency: The compositions prepared in the Examples and Comparative Examples were deposited on a front surface of a monocrystalline wafer by screen printing in a predetermined pattern, followed by drying in an IR drying furnace. Cells formed by this procedure were subjected to baking at 600° C. to 900° C. for 60 seconds to 210 seconds in a belt-type baking furnace, and evaluated as to short circuit current (Isc) and conversion efficiency (%) using a solar cell efficiency tester CT-801 (Pasan Co., Ltd).

Measurement of line width: Each of the compositions for solar cell electrodes prepared as above was printed in a predetermined pattern on a surface of a wafer using a screen mask designed to have a line width of 40 μm by screen-printing. The printed wafer was dried, baked, and then observed through a 3D microscope, thereby obtaining the measurements of the line width of the pattern.

TABLE 2

| Unit: wt % | | | Example |||||||| 
|---|---|---|---|---|---|---|---|---|---|---|
| | | | 1 | 2 | 3 | 4 | 5 | 6 | 7 | 8 |
| (A) Conductive Powder | | | 85 | 85 | 85 | 85 | 85 | 85 | 85 | 85 |
| (B) Glass frit | | | 3 | 3 | 3 | 3 | 3 | 3 | 3 | 3 |
| (C) Organic vehicle | Binder resin | | 6.4 | 7.5 | 5.5 | 7.5 | 7.5 | 7.5 | 7.5 | 7.5 |
| | Solvent | | 5 | 3 | 1 | 3 | 3 | 3 | 3 | 3 |
| (D) Surface tension modifier | (d1) Ethylene glycol | | — | — | — | 1 | — | — | — | — |
| | (d2) Diethylene glycol | | — | — | — | — | 1 | — | — | — |
| | (d3) Triethylene glycol | | — | — | — | — | — | 1 | — | — |
| | (d4) Tetraethylene glycol | | 0.1 | 1 | 5 | — | — | — | — | — |
| | (d5) Polyethylene glycol | | — | — | — | — | — | — | 1 | — |
| | (d6) 1,3-propanediol | | — | — | — | — | — | — | — | 1 |
| | (d7) 1,4-butanediol | | — | — | — | — | — | — | — | — |
| | (d8) 1,5-pentanediol | | — | — | — | — | — | — | — | — |
| | (d9) Propylene carbonate | | — | — | — | — | — | — | — | — |
| | (d10) Formamide | | — | — | — | — | — | — | — | — |
| | (d11) Glycerol | | — | — | — | — | — | — | — | — |
| | (d12) Furfural | | — | — | — | — | — | — | — | — |
| (E) Additive | | | 0.5 | 0.5 | 0.5 | 0.5 | 0.5 | 0.5 | 0.5 | 0.5 |
| Thixotropic index (TI) | | | 7.9 | 6.3 | 3.5 | 5.7 | 6.0 | 5.5 | 6.5 | 5.3 |
| Line width (μm) | | | 85.2 | 80.7 | 76.3 | 81.9 | 82.2 | 79.6 | 81.1 | 76.7 |
| Short circuit current (A) | | | 8.676 | 8.770 | 8.877 | 8.737 | 8.704 | 8.806 | 8.762 | 8.859 |
| Conversion efficiency (%) | | | 16.56 | 16.71 | 17.04 | 16.68 | 16.67 | 16.98 | 16.69 | 17.01 |

TABLE 3

| Unit: wt % | | Example |||||| Comparative Example |||
|---|---|---|---|---|---|---|---|---|---|---|
| | | 9 | 10 | 11 | 12 | 13 | 14 | 1 | 2 | 3 |
| (A) Conductive Powder | | 85 | 85 | 85 | 85 | 85 | 85 | 85 | 85 | 85 |
| (B) Glass frit | | 3 | 3 | 3 | 3 | 3 | 3 | 3 | 3 | 3 |
| (C) Organic vehicle | Binder resin | 7.5 | 7.5 | 7.5 | 7.5 | 7.5 | 7.5 | 8.5 | 0.5 | 1.5 |
| | Solvent | 3 | 3 | 3 | 3 | 3 | 3 | 3 | 10 | 10 |

TABLE 3-continued

| | Unit: wt % | Example | | | | | | Comparative Example | | |
|---|---|---|---|---|---|---|---|---|---|---|
| | | 9 | 10 | 11 | 12 | 13 | 14 | 1 | 2 | 3 |
| (D) Surface tension modifier | (d1) Ethylene glycol | — | — | — | — | — | — | — | — | — |
| | (d2) Diethylene glycol | — | — | — | — | — | — | — | — | — |
| | (d3) Triethylene glycol | — | — | — | — | — | — | — | — | — |
| | (d4) Tetraethylene glycol | — | — | — | — | — | — | — | 1 | — |
| | (d5) Polyethylene glycol | — | — | — | — | — | — | — | — | — |
| | (d6) 1,3-propanediol | — | — | — | — | — | — | — | — | — |
| | (d7) 1,4-butanediol | 1 | — | — | — | — | — | — | — | — |
| | (d8) 1,5-pentanediol | — | 1 | — | — | — | — | — | — | — |
| | (d9) Propylene carbonate | — | — | 1 | — | — | — | — | — | — |
| | (d10) Formamide | — | — | — | 1 | — | — | — | — | — |
| | (d11) Glycerol | — | — | — | — | 1 | — | — | — | — |
| | (d12) Furfural | — | — | — | — | — | 1 | — | — | — |
| (E) Additive | | 0.5 | 0.5 | 0.5 | 0.5 | 0.5 | 0.5 | 0.5 | 0.5 | 0.5 |
| Thixotropic index (TI) | | 5.4 | 5.8 | 4.8 | 7.0 | 5.6 | 5.9 | 6.2 | 2.6 | 2.2 |
| Line width (μm) | | 80.3 | 78.2 | 81.5 | 80.4 | 77.8 | 82.7 | 90.7 | 89.5 | 98.3 |
| Short circuit current (A) | | 8.802 | 8.826 | 8.754 | 8.781 | 8.829 | 8.711 | 8.585 | 8.625 | 8.471 |
| Conversion efficiency (%) | | 16.83 | 16.99 | 16.68 | 16.82 | 17.00 | 16.64 | 16.46 | 16.49 | 16.23 |

With reference to Tables 2 and 3, it may be seen that the compositions in Examples 1 to 14, which satisfied Equation 1 (e.g., had a TI calculated according to Equation 1) and included a surface tension modifier having a surface tension of about 40 mN/m to about 65 mN/m, had excellent fine pattern-printability, and that the solar cell electrodes produced using such compositions exhibited excellent conversion efficiency.

By way of summation and review, electrodes of a solar cell may be formed on a wafer by applying, patterning, and baking an electrode composition. A method of printing a composition for solar cell electrodes on a substrate may include gravure offset printing or screen-printing. For example, a composition for solar cell electrodes may be printed in a fine-line width and high aspect ratio on a substrate. Gravure offset printing may be significantly influenced by viscosity, dryness, and adhesion of the composition, and screen-printing may be significantly influenced by rheology or thixotrophy.

A leveling level and thixotrophy of a composition may be adjusted using a plasticizer to realize narrow line width and high aspect ratio. Gravure offset printing may employ a binder having a high glass transition temperature (Tg) for bilayer electrodes in order to realize high aspect ratio. Silver (Ag) powder may be used to control thixotropy, e.g., a thixotropic index (TI). However, realizing a printed pattern in fine-line width and high aspect ratio may be difficult.

The embodiments may provide a composition for solar cell electrodes that can be printed in a fine line width on a substrate by screen-printing, and may provide excellent conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
   about 50 wt % to about 90 wt % of a conductive powder;
   about 1 wt % to about 15 wt % of a glass frit;
   about 5 wt % to about 40 wt % of an organic vehicle; and
   about 0.33 wt % to about 30 wt % of a surface tension modifier, wherein a weight ratio of the organic vehicle to the surface tension modifier is about 1.3:1 to about 15:1, and
   wherein:
   the surface tension modifier has a surface tension of about 40 mN/m to about 65 mN/m, and
   the composition has a thixotropic index (TI) of about 3 to about 10 as represented by Equation 1:

$$TI = (\text{viscosity at 10 rpm/viscosity at 100 rpm}),  \quad [\text{Equation 1}]$$

in Equation 1, the thixotropic index is calculated using viscosity values of the composition measured at 10 rpm and 100 rpm and at 23° C. with a No. 14 Spindle using a rotary viscometer,
   wherein the organic vehicle includes a binder resin and a solvent, the binder resin including an acrylate resin or a cellulose resin,
   wherein the acrylate resin or cellulose resin is included in the organic vehicle in an amount by weight of 2.5 to about 6 times an amount by weight of the solvent, and
   wherein the surface tension modifier includes propylene carbonate, formamide, or furfural.

2. The composition as claimed in claim 1, wherein the conductive powder includes one or more of silver powder, gold powder, palladium powder, platinum powder, copper powder, chromium powder, cobalt powder, aluminum powder, tin powder, lead powder, zinc powder, iron powder, iridium powder, osmium powder, rhodium powder, tungsten powder, molybdenum powder, nickel powder, or indium tin oxide (ITO) powder.

3. The composition as claimed in claim 1, wherein the glass frit includes a leaded glass frit, a lead-free glass frit, or a mixture thereof.

4. The composition as claimed in claim 1, wherein the glass frit has an average particle diameter (D50) of about 0.1 μm to about 5 μm.

5. The composition as claimed in claim 1, further comprising one or more of a dispersant, a thixotropic agent, a plasticizer, a viscosity stabilizer, an anti-foaming agent, a pigment, a UV stabilizer, an antioxidant, or a coupling agent.

6. The composition as claimed in claim 1, wherein the solvent includes one or more of hexane, toluene, 2-ethoxyethanol, cyclohexanone, 2-butoxyethanol, diethylene glycol monobutyl ether, diethylene glycol dibutyl ether, diethylene glycol monobutyl ether acetate, propylene glycol monomethyl ether, hexylene glycol, terpineol, 2,2,4-trimethyl-1,3-pentanediol monoisobutyrate, methylethylketone, benzylalcohol, γ-butyrolactone, or ethyl lactate.

7. A method of manufacturing a solar cell, the method comprising:
  applying the composition for solar cell electrodes as claimed in claim 1 to a substrate; and
  firing the substrate having the composition thereon.

* * * * *